United States Patent [19]
Kanbara et al.

[11] Patent Number: 5,448,196
[45] Date of Patent: Sep. 5, 1995

[54] PHASE SHIFT CIRCUIT

[75] Inventors: Yoshihiko Kanbara; Tsutomu Nakai, both of Yokohama, Japan

[73] Assignee: Kabushiki Kaisha Toshiba, Kawasaki, Japan

[21] Appl. No.: 230,826

[22] Filed: Apr. 21, 1994

[30] Foreign Application Priority Data

Apr. 21, 1993 [JP] Japan .................. 5-094040

[51] Int. Cl.$^6$ .......................... H03F 3/45; H03K 5/22
[52] U.S. Cl. ..................... 327/231; 327/254; 327/563
[58] Field of Search ............ 307/262, 601, 602, 605, 307/269, 494; 328/55, 133; 327/3, 231, 232, 237, 238, 246, 254, 255, 266, 274, 280, 287, 65

[56] References Cited

U.S. PATENT DOCUMENTS

| | | | |
|---|---|---|---|
| 3,852,624 | 12/1974 | Marik et al. | 328/55 |
| 4,748,346 | 5/1988 | Emori | 307/494 |
| 4,795,923 | 1/1989 | Dobos | 328/55 |
| 4,866,314 | 9/1989 | Traa | 328/55 |
| 4,922,127 | 5/1990 | Denny | 328/55 |

FOREIGN PATENT DOCUMENTS 62-135008  6/1987  Japan .

*Primary Examiner*—Timothy P. Callahan
*Assistant Examiner*—Eunja Shin
*Attorney, Agent, or Firm*—Oblon, Spivak, McClelland, Maier & Neustadt

[57] ABSTRACT

A phase shift circuit suitable for use in an FM detecting circuit of quadrature detection method adopted for a FM radio receiver, for example. The phase shift circuit includes first and second pairs of differential transistors to which input signals are applied as differential inputs in common, first and second current sources for driving the first and second pairs of differential transistors, respectively, a first load circuit connected to respective collectors of the first pair of differential transistors, a second load circuit connected to an output side collector of the second pair of differential transistors and a third pair of differential transistors to which a first signal and a second signal are applied as differential inputs, wherein the first signal is derived from one of the collectors of the first pair of differential transistors, whereas the second signal is derived from the output side collector of the second pair of differential transistors. The resistance load circuit may be of Y-connection and Δ-connection. The resonant circuit is composed of a resistor and a ceramic resonator connected in parallel to each other. Since three differential transistor circuits are connected in parallel, it is possible to realize a low-voltage phase shift circuit which can be activated by a single battery (about 0.9 V).

8 Claims, 3 Drawing Sheets

PHASE SHIFT CIRCUIT

BACKGROUND OF THE INVENTION

1. Field of the Invention

The present invention relates to a phase shift circuit, and more specifically to a phase shift circuit suitable for use in an FM detecting circuit of quadrature detection method adopted for a portable FM radio receiver, for instance.

2. Description of the Prior Art

FIG. 1 shows a conventional FM detecting circuit of quadrature detection method. In the drawing, an FM broadcasting radio wave coming to an antenna is amplified by a high frequency amplifier circuit (not shown), and then the frequency of the amplified radio wave is converted into an intermediate frequency signal by a frequency converting circuit (not shown). The obtained intermediate frequency signal is given to an intermediate frequency amplifier 1 of a differential type, and the output of the intermediate frequency amplifier 1 is separated into two intermediate frequency signals having 90-degrees out of phase with respect to each other through a phase shift circuit 2. The two obtained signals are applied to a multiplier 3 for outputting a multiplication value according to the frequency deviation from the intermediate frequency. This output is further smoothed by a low-pass filter (not shown), and further demodulated to a level signal according to the frequency thereof.

With reference to FIG. 1, the phase shift circuit 2 is described in more detail hereinbelow. The differential outputs of the intermediate frequency amplifier 1, that is, the positive-phase output signal and the negative-phase output signal are given to the bases of two transistors Q1 and Q2 via coupling capacitors C1 and C2, respectively. The respective bases of the transistors Q1 and Q2 are connected to a dc supply voltage Vcc via resistors R1 and R2, respectively for application of a bias voltage thereto. The respective collectors of the transistors Q1 and Q2 are connected to the voltage supply Vcc. Further, the emitters of the two transistors Q1 and Q2 are connected to current sources I1 and I2, respectively. Between the two emitters of the transistors Q1 and Q2, a series-connected resistors R3 and R4 are connected. The resistance ratio of the two resistors R3 and R4 is set to 3:1, as described later. A voltage V1 obtained at the junction point between the two resistors R3 and R4 is applied to the base of a transistor Q3 for constituting a differential amplifier together with a transistor Q4. The emitter of the transistor Q2 is connected to the base of the transistor Q4 via a resistor R7. The respective collectors of the transistors Q3 and Q4 are connected to the supply voltage Vcc via resistors R5 and R6, respectively. The base of the transistor Q4 is connected to the supply voltage Vcc via a ceramic resonator Zc. The ceramic resonator Zc is so determined that the frequency at roughly an intermediate point between the resonant point and the anti-resonant point thereof becomes the intermediate frequency and further the absolute value of the impedance at the intermediate frequency becomes equal to the resistance of the resistor R7. The respective emitters of the transistors Q3 and Q4 are connected to a current source I3. The respective emitter outputs of the emitter-follower transistors Q1 and Q2 are inputted to the multiplier 3 as a first pair of the input signals, and the respective outputs of the transistors Q3 and Q4 (e.g., the phase shift circuit 2) are inputted to the same multiplier 3 as a second pair of the input signals.

In the FM detecting circuit of quadrature detection method as described above, in order to obtain signals whose phases are shifted 90 degrees out of phase with respect to each other, the ceramic resonator Zc designed so as to be vibrated at the intermediate frequency (e.g., 10.7 MHz) is used to eliminate the phase adjustment.

In the above-mentioned circuit configuration, the reason why two 90-degree out-of-phase signals can be obtained will be explained hereinbelow. The differential output signals of the intermediate frequency amplifier 1 are inputted to the bases of the transistors Q1 and Q2 which operate as an emitter follower circuit. Therefore, two opposite-phase signals can be developed at the emitters of the two transistors Q1 and Q2. Here, when the resistance ratio of the resistors R3 and R4 is determined to be 3:1, the relationship between the signal V1 applied to the base of the transistor Q3 and the signal V2 outputted from the emitter of the transistor Q2 can be expressed as $$V1 = (1/2) \cdot V2$$

Further, for instance, if the use frequency of the ceramic resonator is 10.7 MHz and the inductive impedance $|Zc|$ thereof is 1 k$\Omega$ and further if the resistance of the resistor R7 is 1 k$\Omega$, the signal V3 developed at the base of the transistor Q4 can be expressed as $$\begin{aligned} V3 &= \{Zc/(R7 + Zc)\} \cdot V2 \\ &= \{j \cdot 1/(1 + j \cdot 1)\} \cdot V2 \\ &= \{(1 + j \cdot 1)/2\} \cdot V2 \end{aligned}$$

Further, the output voltage of the differential amplifier composed of the transistors Q3 and Q4 is gain-times higher than a difference between the voltages V2 and V3. The signal V4 developed at the collector of the transistor Q3 can be expressed as follows, if the gain of the differential amplifier is A1:

$$\begin{aligned} V4 &= -A1 \cdot (V1 - V3) \\ &= -A1 \cdot [(1/2) \cdot V2 - \{(1 + j \cdot 1)/2\} \cdot V2] \\ &= j \cdot A1 \cdot V2/2 \\ &= j\beta V2 \text{ (where } \beta = A1/2\text{)} \end{aligned}$$

Therefore, it is understood that the output voltage V4 inputted to the first pair of the input terminals of the multiplier 3 is 90 degrees in advance of the output voltage V2 inputted to the second pair of the input terminals of the multiplier 3. FIG. 2 is a vectorial diagram showing the phase relationship among the output voltages V1 to V4.

In the conventional phase shift circuit using a ceramic resonator for the FM detecting circuit of quadrature detection method, since the number of transistors connected in series is large; that is, since two base-emitter voltages Vbe (of the transistors Q1 and Q3) and one current source (I3) are connected in series between the dc supply voltage Vcc and the ground, a dc supply voltage of at least 1.6 V is required to drive the phase shift circuit. This is because, for instance, the voltages Vbe of the transistors Q1 and Q2 are about 0.7 V and the collector-emitter voltage Vce of a current mirror circuit which constitutes the current source I3 is about 0.2 V.

In the case of portable radio receivers, however, it is desirable to drive the phase shift circuit by a single battery of about Vcc=0.9 V, so that there exists a need of a phase shift circuit activated by a lower voltage.

SUMMARY OF THE INVENTION

Accordingly, it is the object of the present invention to provide a phase shift circuit which can be activated by a lower circuit supply voltage.

To achieve the above-mentioned object, the present invention provides a phase shift circuit comprises first and second pairs of differential transistors to which input signals are applied as differential inputs in common, first and second current sources for driving the first and second pairs of differential transistors, respectively, a first load circuit connected to respective collectors of the first pair of differential transistors, a second load circuit connected to an output side collector of the second pair of differential transistors; and a third pair of differential transistors to which a first signal and a second signal are applied as differential inputs, wherein the first signal is derived from one of the collectors of the first pair of differential transistors, whereas the second signal is derived from the output side collector of the second pair of differential transistors.

The first load circuit may include a plurality of resistors connected in Y-connection.

Further, the first load circuit may include a plurality of resistors connected in Δ-connection.

The second load circuit may include a resonant circuit composed of a resistor and a ceramic resonator connected to each other.

Further, the second load circuit may include a resonant circuit composed of a resistor and an reactance element connected in parallel to each other, the reactance element being equal to the resistor in resistance at a predetermined frequency and resistance of the reactance element being variable according to deviation from the predetermined frequency.

Resistance of the first load circuit and current value of the first current source are both adjusted so that dc potentials at differential inputs of the third pair of differential transistors become equal to each other and further real parts of the two in-phase signals outputted from collectors of the first and second pairs of differential transistors become equal to each other.

An absolute impedance value at roughly an intermediate frequency between a resonant point and an anti-resonant point of the ceramic resonator is equal to resistance of the resistor of the resonant circuit.

Bases of the first pair of differential transistors are connected to bases of the second pair of differential transistors, respectively, so that the first signal and the second signal which is derived from the output side collector connected to the second load circuit are different in phase from each other.

DETAILED DESCRIPTION OF THE PREFERRED EMBODIMENTS

Figure 1:
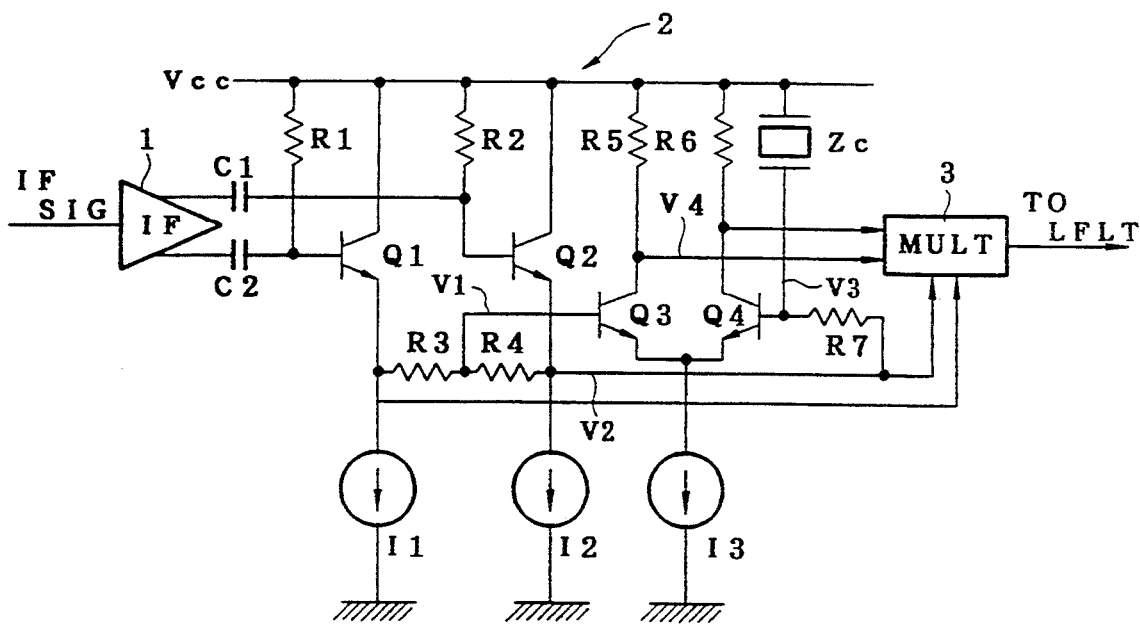
FIG. 1 is a circuit diagram showing a conventional phase shift circuit.
Figure 2:
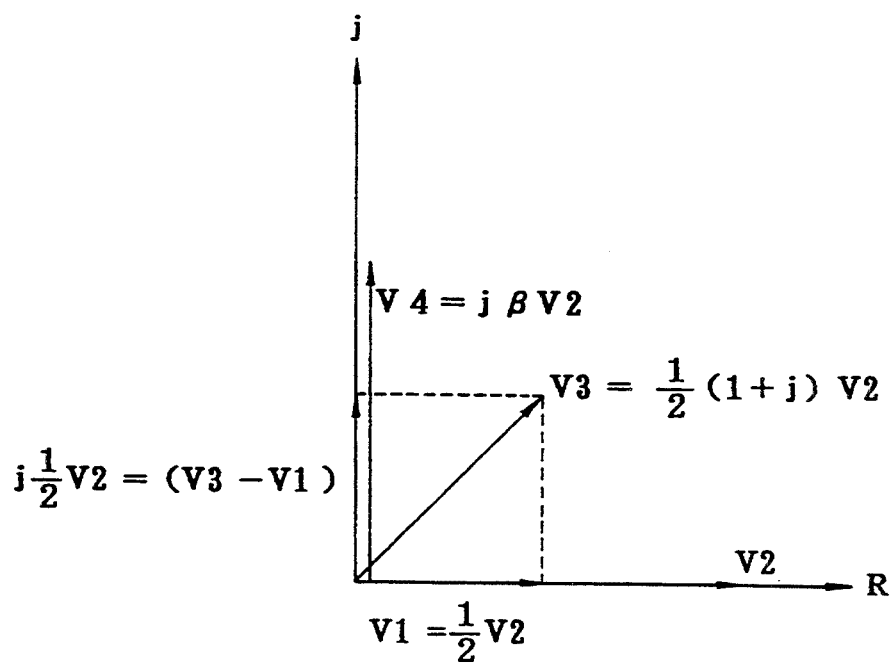
FIG. 2 is a vectorial diagram showing the signal phase relationship in the conventional circuit shown in FIG. 1.

An embodiment of tile present invention will be described hereinbelow with reference to FIG. 3, in which the same reference numerals have been retained for similar parts or elements which have the same functions as with the case of the conventional circuit previously described with reference to FIG. 1, without repeating any detailed description thereof.

Figure 3:
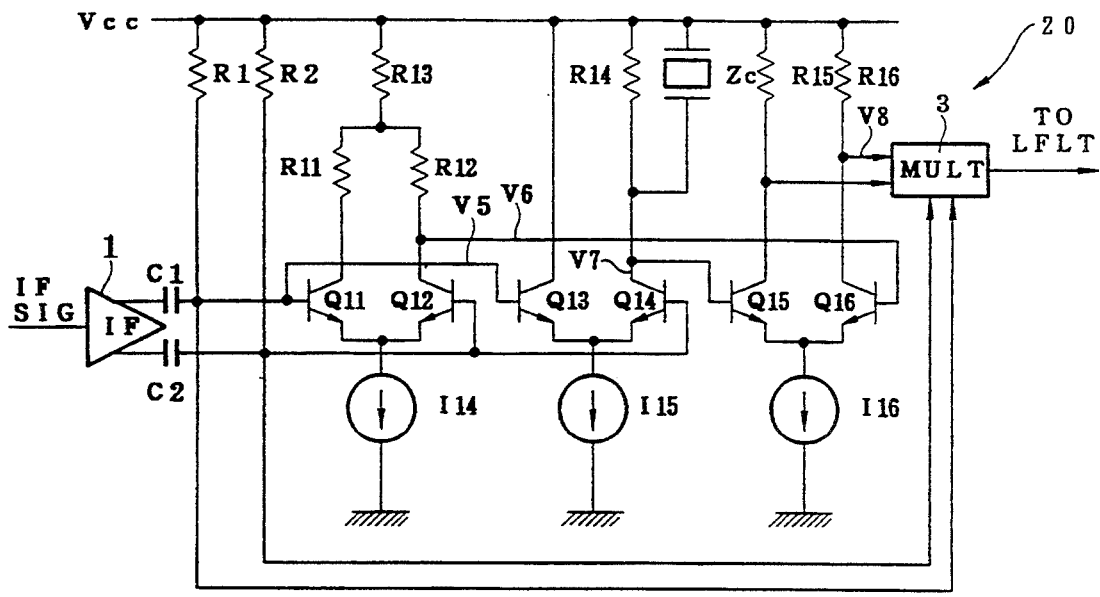
FIG. 3 is a circuit diagram showing an embodiment of the phase shift circuit according to the present invention.

In FIG. 3, the phase shift circuit 20 is composed of three differential amplifiers.

The first differential amplifier is made up of two transistors Q11 and Q12 whose emitters are connected in common; a current source I14 connected to the two emitters; resistors R11 and R12 connected to the collectors of the two transistors Q11 and Q12, respectively; and a resistor R13 connected between the two resistors R11 and R12 and a circuit supply voltage Vcc. These resistors R11, R12 and R13 are connected in Y-connection manner. Further, two bias voltages are applied from the circuit supply voltage Vcc to the bases (the input terminals of the differential amplifier) of the transistors Q11 and Q12 via resistors R1 and R2, respectively.

The second differential amplifier is made up of two transistors Q13 and Q14 whose emitters are connected in common; a current source I15 connected to the two emitters; the circuit supply voltage Vcc connected to the collector of the transistor Q13; and a resistor R14 and a ceramic resonator Zc connected in parallel to each other between the (output side) collector of the transistor Q14 and the circuit supply voltage Vcc. This ceramic resonator Zc is a reactance element which is inductive in the frequency band to be used. Further, the resistance of the resistor R14 is determined to be equal to the impedance of the ceramic resonator Zc at the intermediate frequency between the resonant point and the anti-resonant point thereof. Further, the bases (the input terminals of the differential amplifier) of the transistors Q13 and Q14 are connected to the bases of the transistors Q11 and Q12, respectively.

The third differential amplifier is made up of two transistors Q15 and Q16 whose emitters are connected in common; a current source I16 connected to the two emitters; a resistor R15 connected between the collector of the transistor Q15 and the circuit supply voltage Vcc; and a resistor R16 connected between the collector of the transistor Q16 and the circuit supply voltage Vcc. Further, the bases (the input terminals of the differential amplifier) of the transistors Q15 and Q16 are connected to the collectors of the transistors Q14 and Q12, respectively. The collectors (the output terminals of the differential amplifier) of the transistors Q15 and Q16 are connected to the first pair of the input terminals of the multiplier 3.

The intermediate frequency signal outputted by a frequency converter (not shown) is amplified by the intermediate frequency amplifier 1 of differential type.

The positive-phase output of the intermediate frequency amplifier 1 is given to the respective bases of the transistors Q11 and Q13 of the phase shift circuit 20 via a coupling capacitor C1. The negative-phase output of the intermediate frequency amplifier 1 is given to the respective bases of the transistors Q12 and Q14 of the phase shift circuit 20 via a coupling capacitor C2. As already explained, the outputs of the phase shift circuit 20 can be obtained from the collectors of the transistors Q15 and Q16, and then given to the first pair of the input terminals of the multiplier 3. Further, the positive-phase output and the negative-phase output (differential outputs) of the intermediate frequency amplifier 1 are supplied to the second pair of the input terminals of the multiplier 3 via the coupling capacitors C1 and C2, respectively.

The operation of the phase shift circuit 20 will be described hereinbelow. The signal V5 of the differential output of the intermediate frequency amplifier 1 is amplified by respective gain times by the first differential amplifier (composed of the transistors Q11 and Q12) and by the second differential amplifier (composed of the transistors Q13 and Q14), respectively. Therefore, the signal V6 developed at the collector of the transistor Q12 and the signal V7 developed at the collector of the transistor Q14 can be expressed as $$V6 = \{R12/(4 \cdot V_T/I4)\} \cdot V5$$
$$= \{(R12 \cdot I4)/(4 \cdot V_T)\} \cdot V5$$
$$V7 = \{(R14 \cdot Zc)/(R14 + Zc)/(4 \cdot V_T/I5)\} \cdot V5$$

Where Zc denotes the impedance of the ceramic resonator, and $V_T$ denotes the thermal voltage ($=kT/q$, k: Boltzmann's constant; T: absolute temperature; q: electron charge).

Further, if I4=I5=I; R11=2·R12=R14=1 kΩ; |Zc|=1kΩ, $$V6 = [(1 \cdot I)/\{2 \cdot (4 \cdot V_T)\}] \cdot V5$$
$$V7 = \{(1 \cdot j \cdot 1)/(1 + j \cdot 1)/(4 \cdot V_T/I)\} \cdot V5$$
$$= [1 \cdot (1 + j) \cdot I/\{2 \cdot (4 \cdot V_T)\}] \cdot V5$$

The signals V5 and V6 are in-phase signals, whereas the signal V7 is 45 degrees different in phase from the signal V5.

Further, the output signal V8 of the third differential amplifier (composed of the transistors Q15 and Q16) is the gain times higher than the difference between the signals V7 and V6. Here, if the gain of the third differential amplifier is A2, the signal V8 can be expresses as $$V8 = A2 \cdot (V7 - V6)$$
$$= A2 \cdot \{(1 + j) - 1\} \cdot I/\{2 \cdot (4 \cdot V_T)\} \cdot V5$$
$$= j \cdot \alpha \cdot V5 \ (\alpha: \text{a constant})$$

Therefore, it can be understood that the signal V8 is 90 degrees in advance with respect to the signal V5.

Figure 4:
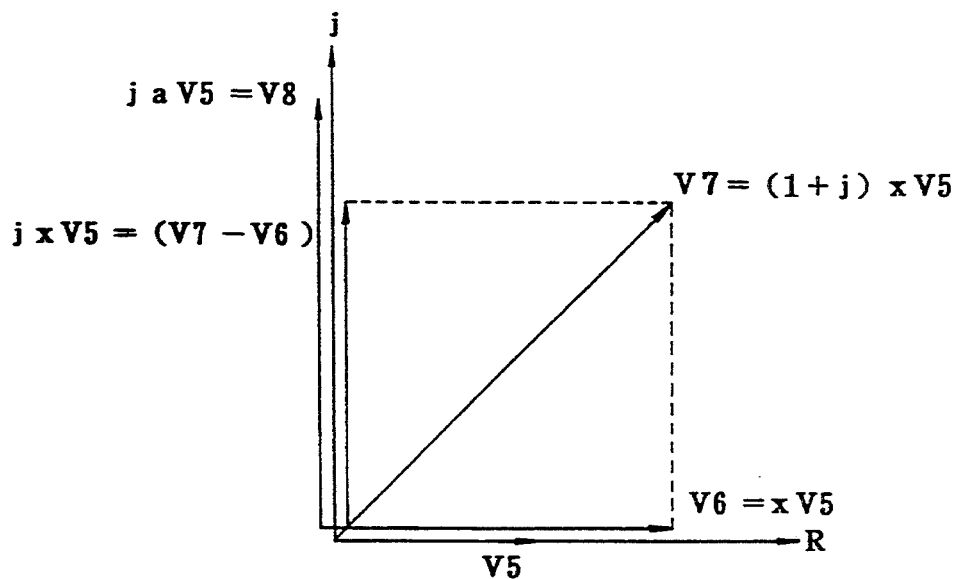
FIG. 4 is a vectorial diagram showing the signal phase relationship in the embodiment shown in FIG. 3.

Further, if the resistance is set as R11=R12=2·R13, since the dc potentials at the bases of the transistors Q15 and Q16 become equal to each other, the third differential amplifier composed of the transistors Q15 and Q16 operates normally as an amplifier. FIG. 4 is a vectorial diagram showing the phase relationship among the signals V5 to V8, in which x denotes a constant.

Figure 5:
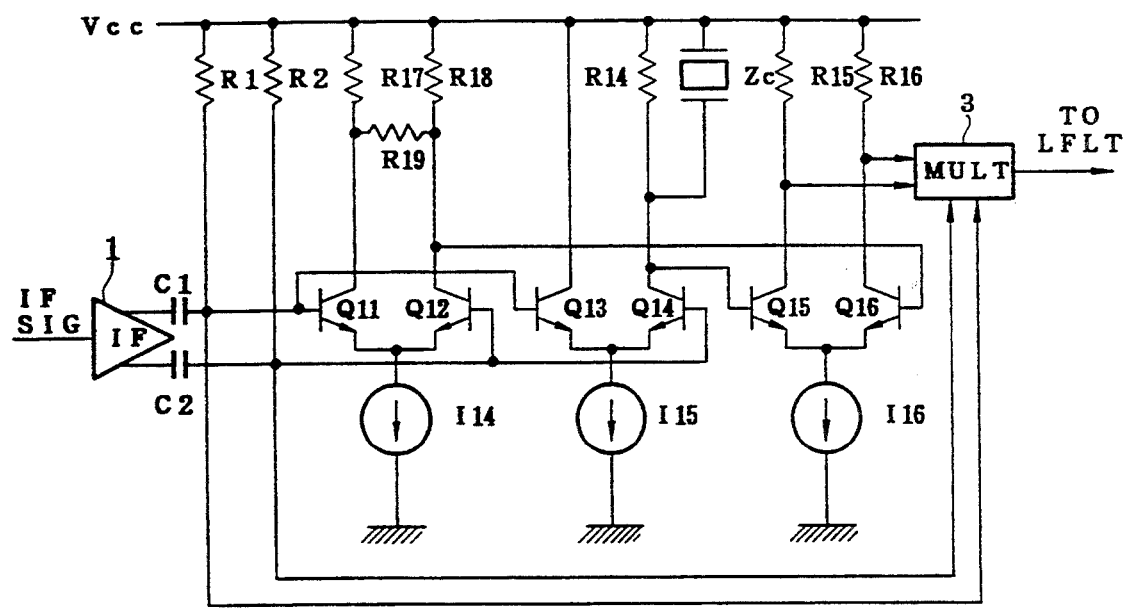
FIG. 5 is a circuit diagram showing a modification of the phase shift circuit according to the present invention.

FIG. 5 shows a modification of the present invention, in which the same reference have been retained for the similar parts or elements having the same functions as in FIG. 3. This modification shown in FIG. 5 is different from the circuit shown in FIG. 3 in that: in the circuit shown in FIG. 3, the load circuit of the first differential amplifier (composed of the transistors Q11 and Q12) is of Y-connection of three resistors R11 to R13. On the other hand, in the circuit shown in FIG. 5, the same load circuit is of Δ-connection of three resistors R17 to R19. The operation of this circuit shown in FIG. 5 is quite the same as with the circuit shown in FIG. 3.

In the phase shift circuit according to the present invention, since the single transistor Vbe and the single current source are connected in series between the dc supply voltage Vcc and the ground, it is possible to drive the phase shift circuit by such a low circuit supply voltage Vcc as 0.9 V, for instance. This is because, for instance, the voltage Vbe of the transistor Q11 is about 0.7 V and the collector-emitter voltage Vce of a current mirror circuit which constitutes the current source I4 is about 0.2 V.

As described above, in the phase shift circuit according to the present invention, since the number of transistors connected in series between the dc supply voltage and the ground can be reduced, it is possible to operate the circuit by use of a single battery (Vcc=0.9 V). Therefore, it is possible to realize a low-voltage phase shift circuit for a low-voltage FM radio receiver using the FM detecting circuit of quadrature detection method using a ceramic resonator, for instance.

What is claimed is:

1. A phase shift circuit, comprising:
   first and second pairs of differential transistors to which input signals are applied as differential inputs in common;
   first and second current sources for driving said first and second pairs of differential transistors, respectively;
   a first load circuit connected to respective collectors of said first pair of differential transistors;
   a second load circuit connected to an output side collector of said second pair of differential transistors;
   a third pair of differential transistors to which a first signal and a second signal are applied as differential inputs; and
   a third load circuit connected to respective collectors of said third pair of differential transistors,
   wherein said first signal is in-phase with one of the input signals and is derived from one of the collectors of said first pair of differential transistors, said second signal is out of phase with said one of the input signals and is derived from said output side collector of said second pair of differential transistors, and the third pair of differential transistors outputs a shifted signal at either collector to which the third load circuit is connected, the shifted signal being out of phase with said one of the input signals.

2. The phase shift circuit of claim 1, wherein said first load circuit includes a plurality of resistors connected in Y-connection.

3. The phase shift circuit of claim 1, wherein said first load circuit includes a plurality of resistors connected in Δ-connection.

4. The phase shift circuit of claim 1, wherein said second load circuit includes a resonant circuit comprising a resistor and a ceramic resonator connected to each other.

5. The phase shift circuit of claim 1, wherein said second load circuit includes a resonant circuit comprising a resistor and a reactance element connected in parallel, the reactance element being having a resistance equal to that of the resistor at a predetermined frequency and the resistance of the reactance element being variable according to deviation from the predetermined frequency.

6. The phase shift circuit of any of claims 2 or 3, wherein a resistance of said first load circuit and a current value of said first current source are both adjusted so that dc potentials at differential inputs of said third pair of differential transistors become equal to each other and further real parts of the two in-phase signals outputted from collectors of the first and second pairs of differential transistors become equal to each other.

7. The phase shift circuit of claim 6, wherein an absolute impedance value at an intermediate frequency between a resonant point and an anti-resonant point of the ceramic resonator is equal to a resistance of the resistor of said resonant circuit.

8. The phase shift circuit of any of claims 4 or 5, wherein bases of said first pair of differential transistors are connected to bases of said second pair of differential transistors, respectively, so that the first signal and the second signal which is derived from said output side collector connected to said second load circuit have different phases.

* * * * *